(12) United States Patent
Ikuta (10) Patent No.: US 8,265,115 B2
(45) Date of Patent: Sep. 11, 2012

(54) SURFACE EMITTING LASER, METHOD FOR MANUFACTURING SURFACE EMITTING LASER, AND IMAGE FORMING APPARATUS

(75) Inventor: Mitsuhiro Ikuta, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 200 days.

(21) Appl. No.: 12/837,272

(22) Filed: Jul. 15, 2010

(65) Prior Publication Data

US 2011/0027924 A1 Feb. 3, 2011

(30) Foreign Application Priority Data

Jul. 28, 2009 (JP) ................................ 2009-175391

(51) Int. Cl.
*H01S 5/00* (2006.01)
(52) U.S. Cl. ............ 372/46.013; 372/46.01; 372/45.011; 372/50.124; 438/32; 438/29
(58) Field of Classification Search ............ 372/46.013, 372/46.01, 45.011, 50.124; 438/32, 29
See application file for complete search history.

(56) References Cited

U.S. PATENT DOCUMENTS

| | | | | |
|---|---|---|---|---|
| 5,493,577 A * | 2/1996 | Choquette et al. | ....... | 372/46.013 |
| 5,903,589 A | 5/1999 | Jewell | | |
| 2005/0083981 A1 | 4/2005 | Kaneko et al. | | |
| 2005/0100068 A1 * | 5/2005 | Jikutani et al. | ................. | 372/46 |
| 2005/0271105 A1 | 12/2005 | Kuromizu | | |
| 2008/0240194 A1 * | 10/2008 | Maeda et al. | ............... | 372/50.1 |
| 2008/0273569 A1 | 11/2008 | Hiraiwa et al. | | |
| 2009/0268769 A1 | 10/2009 | Jikutani | | |

FOREIGN PATENT DOCUMENTS

| | | |
|---|---|---|
| CN | 101111385 A | 1/2008 |
| CN | 101950923 A | 1/2011 |
| JP | 2004-253408 A | 9/2004 |
| JP | 2005-354038 A | 12/2005 |
| JP | 2007-318064 A | 12/2007 |

OTHER PUBLICATIONS

Unold et al., "Large-Area Single-Mode Selectively Oxidized VCSELs: Approaches and Experimental," Proceedings of SPIE, vol. 3946 (2000) pp. 207-218.

Choquette et al., "Advances in Selective Wet Oxidation of AlGaAs Alloys," IEEE Journal of Selected Topics in Quantum Electronics, vol. 3, No. 3, Jun. 1997, pp. 916-926.

* cited by examiner

*Primary Examiner* — Kinam Park
(74) *Attorney, Agent, or Firm* — Canon U.S.A., Inc. IP Division (57) ABSTRACT

A surface emitting laser includes a lower multilayer mirror and an upper multilayer mirror which are provided on a substrate. A first oxidizable layer is partially oxidized to form a first current confinement layer including a first conductive region and a first insulating region. A second oxidizable layer is partially oxidized to form a second current confinement layer including a second conductive region and a second insulating region, a boundary between the first conductive region and the first insulating region being disposed inside the second current confinement layer in an in-plane direction of the substrate. The first oxidizable layer and the second oxidizable layer or layers adjacent to the respective oxidizable layers are adjusted so that when both layers are oxidized under the same oxidizing conditions, the oxidation rate of the first oxidizable layer is lower than that of the second oxidizable layer.

12 Claims, 9 Drawing Sheets

SURFACE EMITTING LASER, METHOD FOR MANUFACTURING SURFACE EMITTING LASER, AND IMAGE FORMING APPARATUS

BACKGROUND OF THE INVENTION

1. Field of the Invention

The present invention relates to a surface emitting laser, a method for manufacturing a surface emitting laser, and an image forming apparatus.

2. Description of the Related Art

A vertical cavity surface emitting laser (VCSEL) which is one of surface emitting lasers is capable of extracting light in a direction vertical to a surface of a substrate. Therefore, a two-dimensional array can be easily formed.

High density and high speed can be realized by parallel processing with a plurality of beams emitted from the two-dimensional array, and various industrial applications such as optical communication and the like are expected. For example, when a surface emitting laser array is used as an exposure light source of an electrophotographic printer, an image forming process with a plurality of beams can be improved in density and speed.

Electrophotographic applications of the type described above require the formation of stable and micro laser spots on a photosensitive drum. Accordingly, stable operations in a single transverse mode and a single longitudinal mode are required laser characteristics of a VCSEL.

In surface emitting lasers, in order to improve performance, there has been developed a method for injecting a current only in a necessary region by forming a current confinement structure using a selective oxidation technique.

This method for forming a current confinement structure includes providing an AlGaAs layer (for example, $Al_{0.98}Ga_{0.02}As$) having a high Al composition ratio in a multilayer mirror and selectively oxidizing the layer in a high-temperature steam atmosphere to form the current confinement structure. Since an oxidized region is converted from a conductive region to an insulating region, a current can be injected into a desired portion of an active layer region.

In order to achieve high output in a selective oxidation-type VCSEL, it is necessary to increase the diameter of an aperture serving as a conductive region of a current confinement structure. However, in a distribution of current carriers, the carriers are concentrated in the edge portion of the aperture, which is a boundary between a conductive region and an insulating region. Therefore, when the diameter of the aperture is increased, high-order transverse mode oscillation with light intensity highly distributed to the edge portion is easily generated.

In an attempt to solve the problem of carrier concentration at the edge portion of the aperture, a method of using two current confinement structures is disclosed by H. J. Unold et al., in "Large-Area Single-Mode Selectively Oxidized VCSELs: Approaches and Experimental", Proceedings of SPIE Photon, West, Vol. 3946 (2000), pp. 207-218, (hereafter "the Unold document"). To illustrate the method of using two current confinement structures, FIG. 10(b) of the Unold document is shown in FIG. 9 herein.

Figure 9:
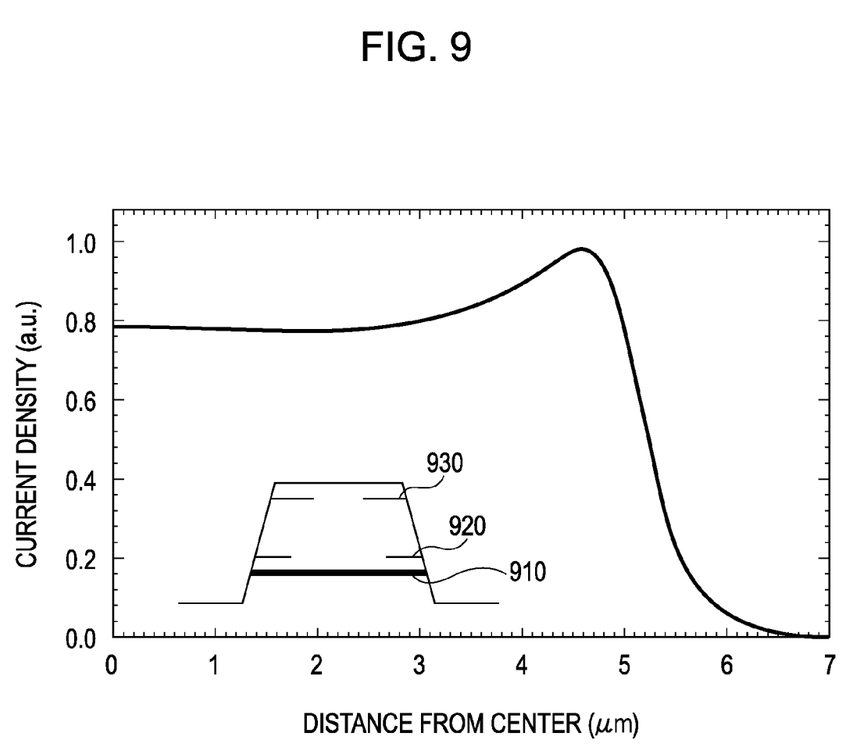
FIG. 9 is a graph for explaining related art.

In the method using two current confinement structures, as illustrated in FIG. 9, a current confinement structure 930 having a smaller aperture diameter than a current confinement structure 920 disposed near an active layer 910 is disposed further away from the active layer 910 than the current confinement structure 920. As a result, charge carriers are concentrated in a central portion of the aperture in the current confinement structure 920 provided nearer to the active layer 910. Since the current confinement structure 920 provided nearer to the active layer 910 controls the mode of resonant light, the efficiency of coupling of the carriers and fundamental mode light is enhanced by injecting the carriers in the central portion of the aperture. Therefore, the use of two current confinement structures can suppress high-order mode oscillation and form high-output surface emitting lasers as compared with use of one current confinement structure.

In order to achieve a single transverse mode, effective coupling of carriers and the fundamental mode light is required. Therefore, in the technique of providing two current confinement structures as described in the Unold document, it is necessary that the aperture diameter of the current confinement structure away from the active layer is smaller than that of the current confinement structure near the active layer.

For example, when the aperture diameter of the current confinement structure 920 disposed near the active layer 910 is 6 to 7 μm, the aperture diameter of the current confinement structure 930 disposed away from the active layer 910 is about a half, i.e., about 3 to 4 μm.

In addition, U.S. Pat. No. 5,493,577 (hereafter "the '577 patent) describes that two oxidized regions constituting two current confinement layers may be the same or different (see, e.g., column 15). The '577 patent also describes that different oxidized regions can be formed by controlling an Al composition; and that different oxidized regions can be formed by using a stepped mesa.

As described above, the Unold document discloses that two current confinement structures are provided, and the aperture diameter of the current confinement structure away from the active layer is smaller than that of the current confinement structure near the active layer.

The '577 patent describes that different oxidized regions can be formed by controlling an Al composition ratio of an oxidizable layer which becomes the current confinement structure. Since the oxidation rate increases as the Al composition ratio of a semiconductor increases, when semiconductor layers having different Al composition ratios are oxidized for the same time, a semiconductor layer having a higher Al composition ratio has a smaller aperture diameter than a semiconductor layer having a lower Al composition ratio.

However, the inventors of the present invention confirmed that from the viewpoint of reliability of a device, a problem is present in a surface emitting laser having a plurality of current confinement structures formed by controlling the Al composition ratio of an upper oxidizable layer to be higher than that of a lower oxidizable layer.

SUMMARY OF THE INVENTION

The present invention provides a surface emitting laser having secured device reliability and including a plurality of current confinement structures, a method for manufacturing the surface emitting laser, and an image forming apparatus including a surface emitting laser array in which a plurality of the surface emitting lasers are arranged.

A surface emitting laser according to an embodiment of the present invention includes a lower multilayer mirror, an active layer, and an upper multilayer mirror which are provided in that order on a substrate; a first current confinement layer provided in the upper multilayer mirror or between the upper multilayer mirror and the active layer and including a first insulating region and a first conductive region which are formed by partially oxidizing a first oxidizable layer; and a second current confinement layer provided at a smaller distance from the active layer than that between the active layer and the first current confinement layer and including a second insulating region and a second conductive region which are formed by partially oxidizing a second oxidizable layer. In the surface emitting laser, a boundary between the first conductive region and the first insulating region is disposed in the second conductive region in an in-plane direction of the substrate, and any one of the following conditions (1) to (3) is satisfied.

(1) The first oxidizable layer and the second oxidizable layer contain Al, and the first oxidizable layer has a lower Al composition ratio than that of the second oxidizable layer.

(2) The first oxidizable layer is thinner than the second oxidizable layer.

(3) One of the layers adjacent to the first oxidizable layer has a higher Al composition than that of one of the layers adjacent to the second oxidizable layer.

A method for manufacturing a surface emitting laser according to an embodiment of the present invention is a method for manufacturing a surface emitting laser including a laminate of a lower multilayer mirror, an active layer, and an upper multilayer mirror which are provided in that order on a substrate. The method includes a step of forming a second oxidizable layer in the laminate, a step of forming a first oxidizable layer above the second oxidizable layer in the laminate, a step of partially oxidizing the first oxidizable layer to form a first current confinement layer including a first conductive region and a first insulating region, and a step of partially oxidizing the second oxidizable layer to form a second current confinement layer including a second conductive region and a second insulating region after the step of forming the first current confinement layer, a boundary between the first conductive region and the first insulating region being disposed inside the second current confinement layer in an in-plane direction of the substrate. The first oxidizable layer and the second oxidizable layer or a layer adjacent to the first oxidizable layer and a layer adjacent to the second oxidizable layer are adjusted so that when both layers are oxidized under the same conditions, the oxidation rate of the first oxidizable layer is lower than that of the second oxidizable layer.

According to the present invention, it is possible to provide a surface emitting laser having secured device reliability and including a plurality of current confinement structures, a method for manufacturing the surface emitting laser, and an image forming apparatus including a surface emitting laser array in which a plurality of the surface emitting lasers are arranged.

Further features of the present invention will become apparent from the following description of exemplary embodiments with reference to the attached drawings.

DESCRIPTION OF THE EMBODIMENTS

As described above, it is necessary that the Al composition ratio of an oxidizable layer for forming a structure having a small aperture diameter is higher than that of an oxidizable layer for forming a structure having a large aperture diameter.

However, in a method of controlling a carrier distribution by a plurality of oxide current confinement structures, a current density increases as the aperture diameter decreases. In particular, the current density increases in a boundary (oxidation front) between a conductive region and an insulating region.

On the other hand, at the oxidation front of a current confinement structure, volumetric contraction is produced by oxidizing an oxidizable layer, and residual stress is concentrated accompanying this volumetric contraction. The stress increases as the Al composition in the oxidizable layer increases.

That is, a high current density and high stress are applied to a current confinement structure disposed away from an active layer, thereby causing deterioration during turning on electricity. There is thus the problem of decreasing reliability of a device.

In addition, in order to form a small aperture diameter, besides control of the Al composition ratio, it is considered to increase the oxidation rate by increasing the thickness of the oxidizable layer. However, when the thickness of the oxidizable layer is increased, residual stress is concentrated due to volumetric contraction after oxidation.

On the other hand, in order to form a small aperture diameter, it is considered to increase the oxidation rate of the oxidizable layer by decreasing the Al composition ratio of a layer adjacent to the oxidizable layer. However, when the Al composition ratio of a layer adjacent to the oxidizable layer is decreased, residual stress in the oxidizable layer after oxidation cannot be relieved, and thus the stress remains.

As described above, the inventors found that when the oxidation rate of the oxidizable layer is increased for decreasing the aperture diameter of a current confinement structure disposed away from the active layer, the reliability of a device is degraded.

A surface emitting laser, a method for manufacturing the surface emitting laser, and the like which are intended for resolving the above-mentioned problems are described in detail below.

First Embodiment (Configuration of Surface Emitting Laser)

Figure 1A:
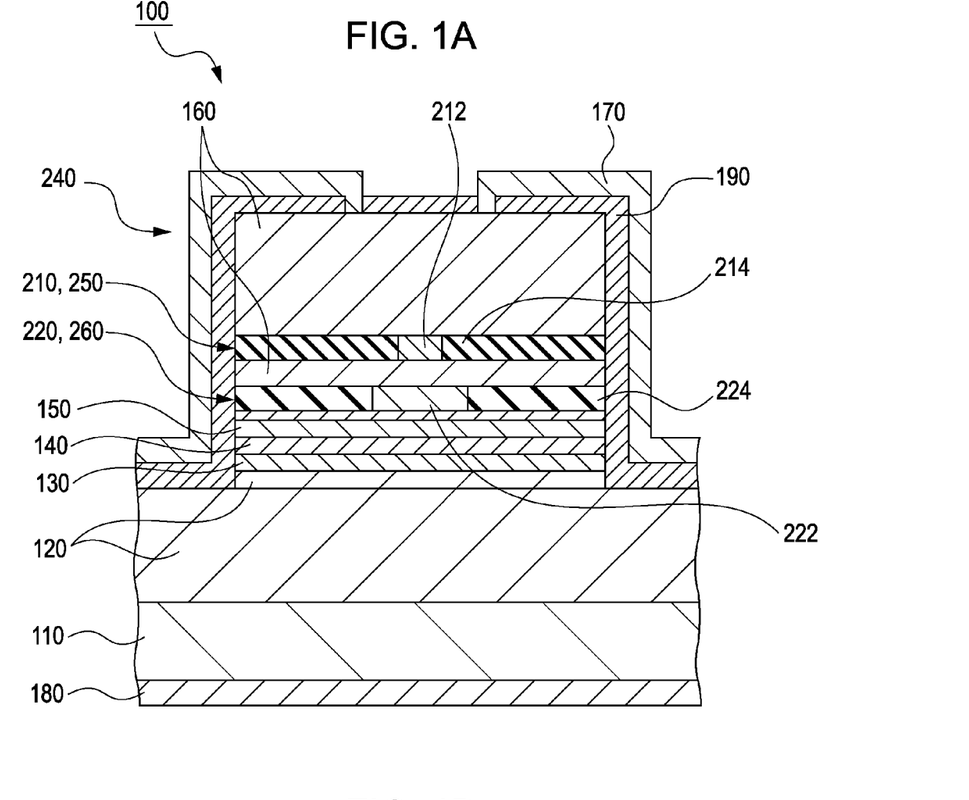
FIGS. 1A and 1B schematically show a surface emitting laser according to an embodiment of the present invention.
Figure 1B:
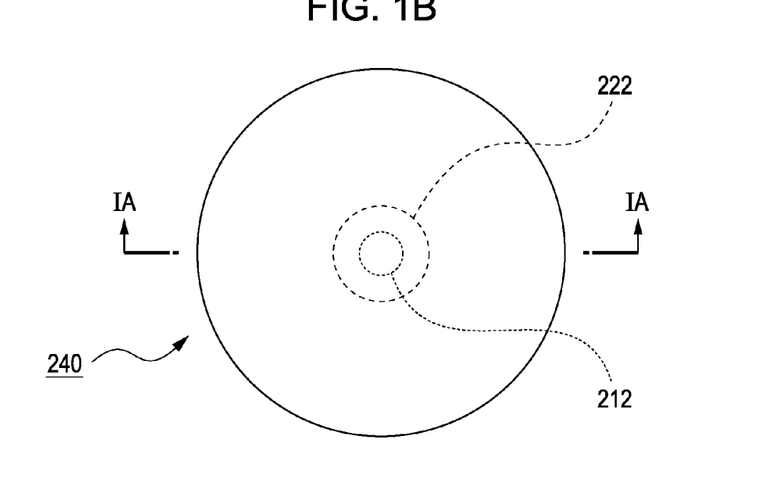

FIG. 1A is a drawing schematically illustrating a sectional view (along line IA-IA of FIG. 1B) of a surface emitting laser 100 according to an embodiment of the present invention. FIG. 1B is a drawing schematically illustrating a top view of a surface emitting laser 100 according to an embodiment of the present invention.

In FIG. 1A, a lower multilayer mirror 120, a lower spacer layer 130, an active layer 140, an upper spacer layer 150, and an upper multilayer mirror 160 are formed in that order on a substrate 110, forming a laser resonator in a direction vertical to a surface of the substrate 110. When carriers are injected into the active layer 140 from an upper electrode 170 provided on the upper multilayer mirror 160 and a lower electrode 180 provided below the substrate 110, the active layer 140 emits light, resulting in oscillation of the surface emitting laser 100.

A first current confinement layer 210 is provided in the upper multilayer mirror 160. The first current confinement layer 210 has a first insulating region 214 and a first conductive region 212. The first insulating region 214 and the first conductive region 212 are formed by partially oxidizing a first oxidizable layer 250. The first current confinement layer 210 has the function of injecting current in a central portion of the active layer 140.

A second current confinement layer 220 is provided at a position nearer to the active layer 140 than the first current confinement layer 210. For example, the second current confinement layer 220 is provided between the first current confinement layer 210 and the active layer 140. The second current confinement layer 220 has a second insulating region 224 and a second conductive region 222 that are formed by partially oxidizing a second oxidizable layer 260. The second confinement layer 220 has the function to control a mode of resonant light.

Although, in FIG. 1A, the first current confinement layer 210 and the second current confinement layer 220 are provided above the active layer 140, the second current confinement layer 220 may be provided below the active layer 140. In addition, in FIG. 1A, the first current confinement layer 210 is provided in a layer of the upper multilayer mirror 160, but may not be necessarily provided in the upper multilayer mirror 160. Moreover, it should be noted that the denomination of "first" and "second" layers is used in this specification for purposes of convenience only. As long as at least two confinement layers exist, it does not matter the order in which the layers are denominated.

A trench structure 240 is provided to extend from the upper surface of the upper multilayer mirror 160 to at least the upper surface of the second current confinement layer 220, passing through the first current confinement layer 210. Therefore, a semiconductor layer which faces the trench structure 240 is oxidized from the side wall to form the first insulating region 214 and the second insulating region 224. The length (or depth) of trench structure 240 extends from the upper surface of the upper multilayer mirror 160 and may be stopped at a center of the second current confinement layer 220 or may pass through the second current confinement layer 220.

When the surface emitting laser 100 is viewed from above, as shown in FIG. 1B, the first conductive region 212 has a smaller size than the second conductive region 222, and the boundary between the first conductive region 212 and the first insulating region 214 is found inside the second conductive region 222.

This state may be expressed as "the boundary between the first conductive region 212 and the first insulating region 214 is present inside the second conductive region 222 in an in-plane direction of the substrate".

Figure 8:
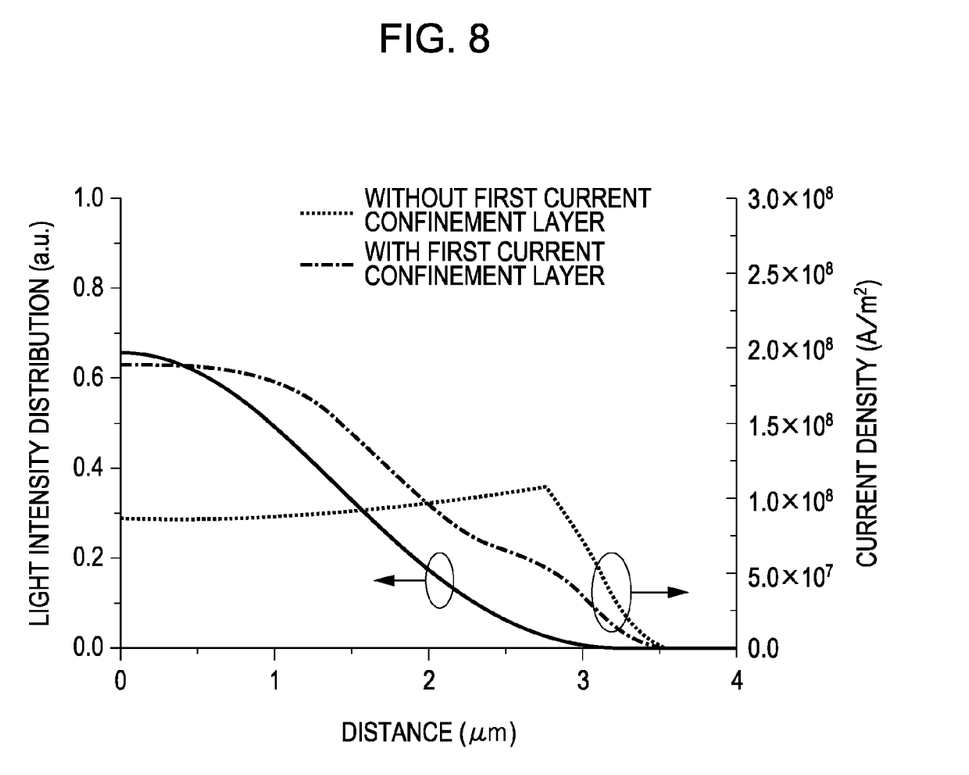
FIG. 8 is a graph for explaining the characteristics of an embodiment of the present invention.

The presence of the first conductive region 212 increases coupling of a fundamental mode light intensity distribution and a current distribution as shown in FIG. 8. FIG. 8 is a plot of the light intensity distribution of the fundamental mode of a surface emitting laser, and the current density distributions near an active layer. The horizontal axis of FIG. 8 represents the distance from the center of the optical axis in the in-plane direction of a substrate. Therefore, the surface emitting laser 100 can be operated in a single transverse mode within a wide range of driving currents.

In addition, the magnitude of residual stress produced in the boundary between the first conductive region 212 and the first insulating region 214 in a step of forming both regions is controlled to be smaller than that produced in the boundary between the second conductive region 222 and the second insulating region 224 in a step of forming both regions. As a result, the reliability of the device is improved as compared with the case in which such control is not performed.

In order to control the magnitude of residual stress as described above, the first oxidizable layer 250 and the second oxidizable layer 260 are controlled so that under the same oxidizing conditions, the oxidation rate of the first oxidizable layer 250 is lower than that of the second oxidizable layer 260. Alternatively, a layer adjacent to the first oxidizable layer 250 and a layer adjacent to the second oxidizable layer 260 are controlled so that under the same conditions, the oxidation rate of the first oxidizable layer 250 is lower than that of the second oxidizable layer 260.

The oxidation rate of an oxidizable layer decreases as the Al composition ratio of the oxidizable layer decreases, the thickness of the oxidizable layer decreases, or the Al composition ratio of the periphery of the oxidizable layer increases. On the other hand, the residual stress in a boundary between an oxidized region and an unoxidized region after oxidation of the oxidizable layer decreases as the Al composition ratio of the oxidizable layer decreases, the thickness of the oxidizable layer decreases, or the Al composition ratio of the periphery of the oxidizable layer increases. In addition, the residual stress in the boundary between an oxidized region and an unoxidized region after oxidation of the oxidizable layer decreases as the oxidation rate of the oxidizable layer decreases.

(Method for Manufacturing Surface Emitting Laser)

In a layer structure in which under the same conditions, the oxidation rate of the first oxidizable layer is lower than that of the second oxidizable layer, when the two oxidizable layers are simultaneously oxidized, the second conductive region 222 becomes smaller than the first conductive region 212. In this case, effective single transverse mode characteristics cannot be achieved.

Therefore, this embodiment uses the manufacturing method including forming the first current confinement structure by oxidizing the first oxidizable layer, and then forming the second current confinement structure by oxidizing the second oxidizable layer. Consequently, the sizes of the first conductive region 212 and the second conductive region 222 can be determined independently of the oxidization rates of the oxidizable layers.

Next, the specified configuration of the surface emitting laser including a substrate and a laminate stacked on the substrate according to the embodiment and the manufacturing method therefor are described.

The substrate 110 is, for example, an n-type doped GaAs substrate. The laminate including a lower multilayer mirror 120, an active layer 140, and an upper multilayer mirror 160 provided on (stacked) the substrate 110 can be formed in stages using known fabrication methods. The n-type lower multilayer mirror 120 is formed by alternately laminating $Al_{0.9}Ga_{0.1}As$ with an optical thickness of $\lambda/4$ and $Al_{0.5}Ga_{0.5}As$ with an optical thickness of $\lambda/4$ on the substrate 110. For example, the number of pairs is 70. In addition, $\lambda$ is the resonant wavelength of a resonator and is, for example, 680 nm in terms of vacuum wavelength.

For example, the AlGaInP-based active layer 140, specifically, the active layer 140 having a GaInP/AlGaInP multi-quantum well structure having an emission peak at $\lambda=680$ nm, is formed by crystal growth on the lower multilayer mirror 120. In addition, the lower spacer layer 130 and the upper spacer layer 150 are formed, for phase adjustment of the resonator, below and above the active layer 140, respectively. The total optical thickness of the lower spacer layer 130, the active layer 140, and the upper spacer layer 150 is an integral multiple of $\lambda/2$, for example, $\lambda$.

The p-type upper multilayer mirror 160 is grown on the active layer 140. The upper multilayer mirror 160 is composed of, for example, repetitions of 40 pairs of $Al_{0.9}Ga_{0.1}As$ with an optical thickness of $\lambda/4$ and $Al_{0.5}Ga_{0.5}As$ with an optical thickness of $\lambda/4$. A portion of the upper multilayer mirror 160 is replaced with an AlGaAs layer having a higher Al composition ratio than those of AlGaAs constituting the pairs of the upper multilayer mirror 160, providing an oxidizable layer. The oxidizable layer is partially oxidized to form a current confinement layer including an oxidized insulating region and a unoxidized conductive region. For example, when oxidizable layers are formed at two positions in the upper multilayer mirror 160, the second oxidizable layer 260 and the first oxidizable layer 250 are disposed at the positions of the 1st pair and the 6th pair, respectively, in the upper multilayer mirror 160 from the active layer 140. The present invention is not limited to this form, but may have another form in which, for example, the first oxidizable layer 250 is disposed in the upper multilayer mirror 160, and the second oxidizable layer 260 is disposed in the lower multilayer mirror 120.

As the oxidizable layers, for example, an AlGaAs layer can be used. For example, $Al_xGa_{1-x}As$ ($0.95 \leqq x \leqq 1$) is easily oxidized to an insulator containing an Al oxide by, for example, heating to 300° C. or more and exposure to steam.

In addition, a semiconductor contact layer is formed as a top layer of the upper multilayer mirror 160 in order to make contact with the upper electrode 170. The semiconductor contact layer is, for example, a GaAs layer of 20 nm.

Crystal growth of the above-described laminate is performed by, for example, a MOCVD (Metal-Organic Chemical Vapor Deposition) method.

(Layer Configuration of Oxidizable Layer)

The first oxidizable layer 250 and the second oxidizable layer 260 or a layer adjacent to the first oxidizable layer 250 and a layer adjacent to the second oxidizable layer 260 are adjusted so that under the same oxidizing conditions, the oxidation rate of the first oxidizable layer 250 is lower than that of the second oxidizable layer 260. As an adjusting method, any one or more of the following parameters: (1) the Al composition ratio of an oxidizable layer, (2) the thickness of an oxidizable layer, and (3) the Al composition ratio of an adjacent layer can be adjusted. The order of the influences on the oxidation rate is generally (1)>(2)>(3).

(1) Al Composition Ratio of an Oxidizable Layer

When the Al composition ratio of the first oxidizable layer 250 is decreased to be lower than that of the second oxidizable layer 260, residual stress can be decreased. For example, $Al_{0.98}Ga_{0.02}As$ can be used for the first oxidizable layer 250, and AlAs can be used for the second oxidizable layer 260.

When these layers are oxidized, specifically, the rates of volume changes of AlAs and $Al_{0.98}Ga_{0.02}As$ are −11% and −2%, respectively. With a lower Al composition ratio, the volume reduction due to oxidation is small, thereby decreasing the residual stress applied to the boundary between the oxidized region and the unoxidized region.

With respect to the oxidation rate, when a layer of $Al_{0.5}Ga_{0.5}As$ is adjacent to AlAs and $Al_{0.98}Ga_{0.02}As$ each having a thickness of 30 nm, for example, the oxidation rate ratio is about 2 times in oxidation at 440° C. and about 30 times in oxidation at 370° C.

According to the manufacturing method described below, the first oxidizable layer can be little oxidized by oxidation of the second oxidizable layer. Therefore, from this viewpoint, the difference in oxidation rate between the first oxidizable layer and the second oxidizable layer is opposite to that of related art. Therefore, as described above, the Al composition ratio of the first oxidizable layer 250 is lower than that of the second oxidizable layer 260. The difference between the Al composition ratios is preferably 1% or more and more preferably 2% or more. When the Al composition ratios of the first oxidizable layer 250 and the second oxidizable layer 260 are excessively decreased, the AlGaAs layer of the multilayer reflecting mirror is also oxidized, thereby decreasing the mechanical strength of the device. Therefore, the Al composition ratio of the second oxidizable layer 260 is preferably 98% or more, more preferably 99% or more, and most preferably 100%.

(2) Thickness of an Oxidizable Layer

As the thickness of an oxidizable layer is decreased, the amount of volume reduction by oxidation can be decreased, thereby decreasing the residual stress. Therefore, the first oxidizable layer is thinner than the second oxidizable layer. For example, the thickness of the first oxidizable layer 250 is 20 nm, and the thickness of the second oxidizable layer is 30 nm.

As described above, for the convenience of the manufacturing method according to the present invention, the oxidation rate of the first oxidizable layer 250 is different from that of the second oxidizable layer 260.

The difference in oxidation rate due to the thickness of a layer becomes remarkable as the thickness decreases. Therefore, the first oxidizable layer may be somewhat thin. The thickness of the first oxidizable layer is preferably 30 nm or less and more preferably 20 nm or less.

In addition, the dependency of the oxidation rate on the thickness increases as the oxidation temperature decreases. For example, oxidation of AlAs with a thickness of 60 nm and AlAs with a thickness of 30 nm at 440° C. causes substantially no difference in oxidation rate. However, oxidation of AlAs with a thickness of 60 nm and AlAs with a thickness of 30 nm at 370° C. causes a difference of about 2 times in oxidation rate. Therefore, the second oxidizable layer is oxidized at as low temperature as possible, and thus the Al composition ratio of the second oxidizable layer is set to be higher than that of the first oxidizable layer. Therefore, a more desirable design is achieved by combining (1) and (2).

(3) Al Composition Ratio of an Adjacent Layer

When a layer adjacent to an oxidizable layer has such an Al composition ratio (e.g., 0.9 or less) that it is not oxidized, the residual stress applied to a boundary of an oxidized region of the oxidizable layer decreases as the Al composition ratio of the adjacent layer increases. This is because the adjacent layer having a higher Al composition ratio can relieve the stress on the oxidized oxidizable layer due to a difference in surface tension as compared with the adjacent layer having a lower Al composition ratio. Therefore, the layer adjacent to the first oxidizable layer 250 desirably has a higher Al composition ratio than that of the layer adjacent to the second oxidizable layer 260. In addition, according to the manufacturing method described below, the first oxidizable layer 250 may be little oxidized by oxidation of the second oxidizable layer 260. Therefore, also from this viewpoint, the layer adjacent to the first oxidizable layer 250 desirably has a higher Al composition ratio than that of the layer adjacent to the second oxidizable layer 260. When the Al compositions of the adjacent layers are adjusted as described above, the oxidation rate of the first oxidizable layer 250 becomes lower than that of the second oxidizable layer 260.

As the Al composition ratio of an oxidizable layer increases, the difference between the oxidation rates of the oxidizable layers due to the difference in Al composition ratio between the layers adjacent to the respective oxidizable layers becomes remarkable. Also, as the oxidation temperature decreases, the difference becomes remarkable.

When a layer adjacent to an oxidizable layer has such a high Al composition ratio that it is not oxidized, the adjacent layer has the effect of decreasing electric resistance (hetero barrier) at the interface between an unoxidized region of the oxidizable layer and the adjacent layer. Therefore, a layer having a high Al composition ratio can be formed as the layer adjacent to the first oxidizable layer 250 in which the first current confinement structure with the highest current density is formed. For example, when the first oxidizable layer 250 is composed of $Al_{0.98}Ga_{0.02}As$, a graded layer in which the composition is graded from $Al_{0.9}Ga_{0.1}As$ to $Al_{0.5}Ga_{0.5}As$ from the oxidizable layer side can be used as the layer adjacent to the first oxidizable layer 250. The graded layer can be used from the viewpoint of decreasing the electric resistance at the interface of the oxidizable layer.

Then, a semiconductor process shown in FIGS. 2A to 2F, 3G to 3L, and 4 is performed for a wafer subjected to the above-described growth.

The process described below is a process of performing oxidation of the first oxidizable layer 250 and oxidation of the second oxidizable layer 260 with different timings. Specifically, the oxidation of the second oxidizable layer 260 is performed after the oxidation of the first oxidizable layer 250.

Figure 2A:
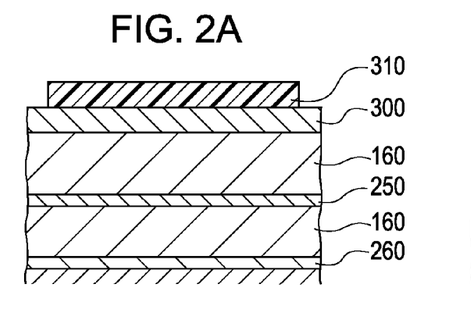
FIGS. 2A to 2F schematically show a method for manufacturing a surface emitting laser according to an embodiment of the present invention.

First, as shown in FIG. 2A, a first dielectric layer 300 is deposited as a protective layer on the upper multilayer mirror 160. The first dielectric layer 300 is composed of, for example, $SiO_2$ having a thickness of 1 μm and can be deposited by, for example, a plasma CVD method.

Then, photoresist 310 is applied to the first dielectric layer 300 and then subjected to patterning and development so that an aperture pattern is formed at the position corresponding to the trench structure 240.

The trench structure 240 is has an inner diameter of, for example, 27 μm. The outer diameter of the trench structure 240 is, for example, 33 μm. The trench structure 240 is not shown in FIG. 2A.

Figure 2B:
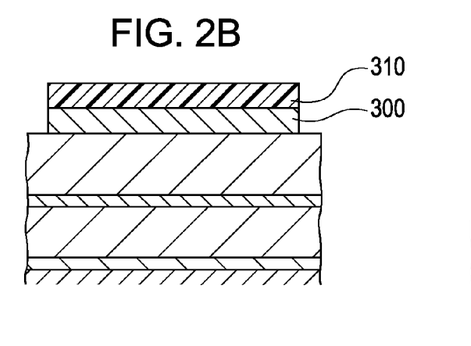

Next, as shown in FIG. 2B, the first dielectric layer 300 is etched using the patterned resist 310 as a mask. The etching may be, for example, wet etching with BHF (buffered hydrofluoric acid) or dry etching with a plasma of $CHF_3$ gas.

Figures 2C, 2F:
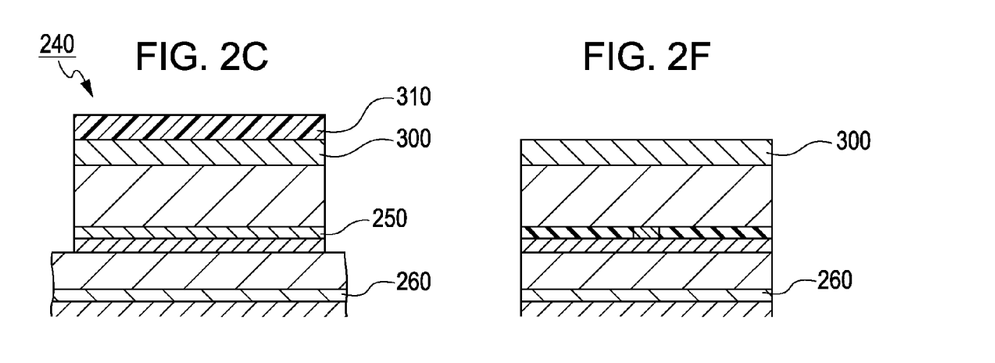

Then, as shown in FIG. 2C, semiconductor layers are dry-etched using the resist 310 and the first dielectric layer 300 as a mask to form the trench structure 240. In this case, the etching is performed so that the trench structure 240 reaches at least the top surface of the first oxidizable layer 250, but not reach the top surface of the second oxidizable layer 260. The dry etching is performed with, for example, a plasma of $SiCl_4$ gas and Ar gas.

Figure 2D:
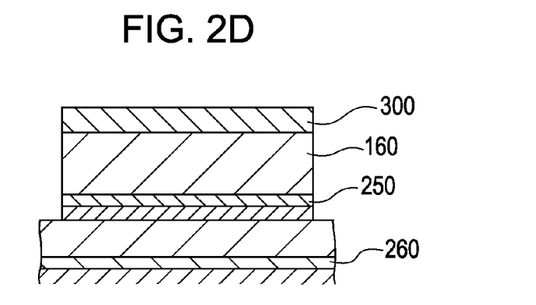

Next, as shown in FIG. 2D, the resist 310 remaining on the first dielectric layer 300 is removed by, for example, asking with an oxygen plasma.

Figure 2E:
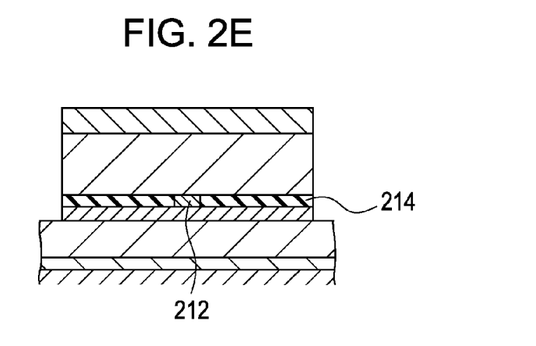

Next, as shown in FIG. 2E, the first oxidizable layer 250 is oxidized from the side wall exposed in the trench structure 240 to form the first insulating region 214. The oxidation is performed by, for example, heating the substrate to 450° C. and exposing it to stream. An oxidized portion of the oxidizable layer becomes an insulator composed of polycrystal or amorphous Al oxide as a main component. In addition, an unoxidized region, i.e., the first conductive region 212, remains in the central portion of the first oxidizable layer 250. The first conductive region 212 has, for example, a circular shape having a diameter of 4 μm.

Next, as shown in FIG. 2F, semiconductor layers are etched from the bottom of the trench structure 240 using the first dielectric layer 300 as a mask to expose the second oxidizable layer 260. The etching is dry etching with, for example, a plasma of $SiCl_4$ gas and Ar gas. The etching may be wet etching.

For example, in order to improve heat radiation, an AlAs layer may be used as a low-refractive-index layer in the lower multilayer mirror 120. In this case, etching of the trench structure 240 is stopped so as not to expose AlAs of the lower multilayer mirror 120.

Figure 3G:
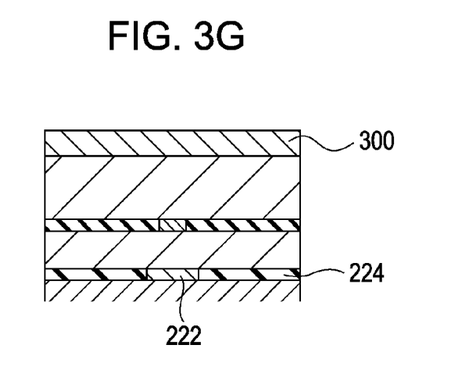
FIGS. 3G to 3L schematically show a method for manufacturing a surface emitting laser according to another embodiment of the present invention.

Next, as shown in FIG. 3G, the second oxidizable layer 260 is oxidized from the side wall exposed in the trench structure 240 to form the second insulating region 224. The oxidation is performed by, for example, heating the substrate to 400° C. and exposing it to stream.

Since the surface of the first oxidizable layer 250 has already been oxidized, in many cases, oxidation of the first oxidizable layer 250 little proceeds even when the substrate is heated and exposed to stream in this step.

However, in order to minimize the oxidation of the first oxidizable layer 250 in this step, the heating temperature of the substrate in the oxidation of the second oxidizable layer 260 is as lower as possible than that in the oxidation of at least the first oxidizable layer 250. Therefore, the Al composition ratio of the second oxidizable layer 260 is set to be higher than that of the first oxidizable layer 250 or the thickness of the second oxidizable layer 260 is set to be larger than that of the first oxidizable layer 250. Of course, both the Al composition ratio and the thickness may be controlled. In addition, when the Al composition ratio of one of the semiconductor layers adjacent to the first oxidizable layer 250 is set to be higher than that of one of the semiconductor layers adjacent to the second oxidizable layer 260, oxidation of the first oxidizable layer 250 can be further suppressed.

Further, the unoxidized region, i.e., the second conductive region 222, is left in the central portion of the second oxidizable layer 260. The second conductive region 222 has, for example, a circular shape having a diameter of 6 μm, a square shape having a side of 6 μm, or a shape intermediate between the circular and square shapes. In this case, the distance between the boundary (oxidation front) between the second conductive region 222 and insulating region and the inner periphery of the trench structure 240 is 10.5 μm. That is, the oxidation distance is 10.5 μm.

Figure 3H:
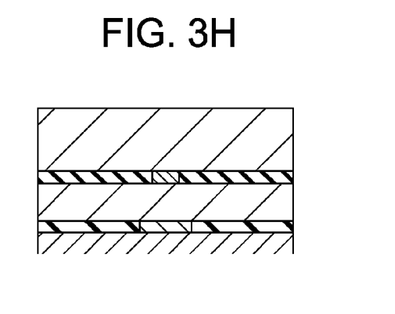

Next, as shown in FIG. 3H, the remaining first dielectric layer 300 has been removed using, for example, buffered hydrofluoric acid.

Figure 3I:
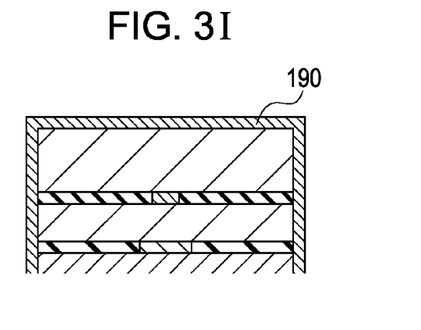

Next, as shown in FIG. 3I, an insulating film 190 is deposited over the whole device. The insulating film 190 includes, for example, a dielectric layer with an optical thickness of λ/2 and composed of, for example, silicon oxide, and can be deposited by, for example, plasma CVD.

Figure 3J:
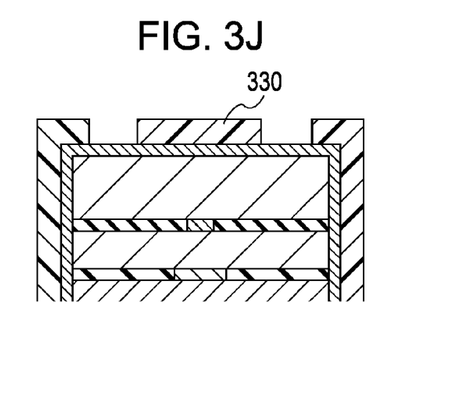

Next, as shown in FIG. 3J, a photoresist 330 is applied and subjected to patterning exposure and development for partially removing the insulting film 190 in order to make contact between the semiconductor contact layer and the upper electrode 170 which is formed latter.

Figure 3K:
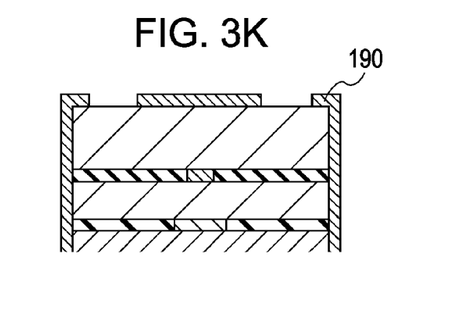

Next, as shown in FIG. 3K, the insulating film 190 is partially removed using the resist 330 as a mask. Then, the resist 330 is removed.

Figure 3L:
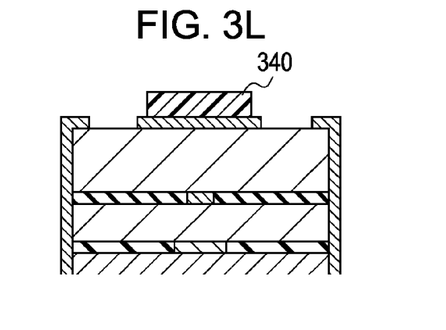

Next, as shown in FIG. 3L, a photoresist 340 for liftoff is applied and subjected to patterning for forming the upper electrode 170 by a liftoff method, forming a resist pattern for liftoff.

Figure 4:
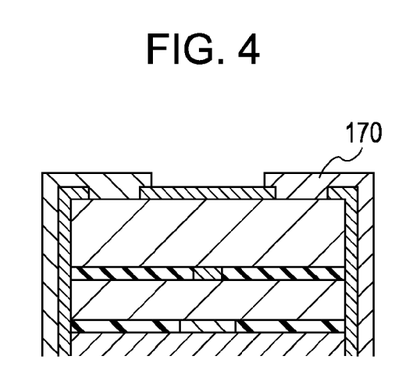
FIG. 4 schematically shows a method for manufacturing a surface emitting laser according to an embodiment of the present invention.

Next, as shown in FIG. 4, the upper electrode 170 is formed by, for example, electron beam evaporation or the like and the liftoff method. The upper electrode 170 is composed of, for example, Ti/Au.

The upper electrode 170 has, for example, a ring shape having an opening at the center thereof. The opening is larger than the first conductive region 212 so as not to interfere with leaser emitted light therethrough. The size of the opening in the upper electrode 170 may be larger or smaller than the second conductive region 222. When the size of the opening is smaller than the second conductive region 222, the upper electrode 170 overlaps a portion of the periphery of an emission region. In a higher-order mode than the fundamental mode, the overlap between the light intensity distribution and the upper electrode 170 is increased. Therefore, when the upper electrode 170 causes a light loss such as a scattering effect or the like in each of the modes, the upper electrode 170 has the effect of further suppressing a higher-order mode.

Finally, the lower electrode 180 is formed on the back of the substrate by, for example, resistance heating evaporation. The lower electrode 180 is composed of, for example, AuGe/Au.

In the above-describe process, oxidation of the first oxidizable layer 250 and oxidation of the second oxidizable layer 260 are performed with different timings.

The second oxidizable layer 260 is oxidized under conditions (second oxidation conditions) different from conditions (first oxidation conditions) for oxidizing the first oxidizable layer 250. Specifically, the second oxidizable layer 260 is oxidized under such conditions that the oxidation rate is lower than that of oxidation of the first oxidizable layer 250. As a result, oxidation of the first oxidizable layer 250 can be prevented from proceeding in the step of oxidizing the second oxidizable layer 260.

As these conditions, for example, the substrate temperature of the second oxidation conditions can be made lower than the substrate temperature of the first oxidation conditions. In the second oxidation conditions, the oxidizer concentration in the atmosphere can be made lower than that in the first oxidation conditions. As the oxidizer, for example, $H_2O$ can be used. In addition, in the second oxidation conditions, the oxidation inhibitor concentration in the atmosphere can be made higher than that in the first oxidation conditions. As the oxidation inhibitor, for example, $O_2$ can be used. The reaction rate in the step of oxidizing AlGaAs can be decreased by increasing the amount of $O_2$.

Second Embodiment

In the first embodiment, the second oxidizable layer is not exposed in the trench structure when the first oxidizable layer is oxidized. The second oxidizable layer is exposed by further etching the bottom of the trench structure after the first oxidizable layer is oxidized.

Figure 5:
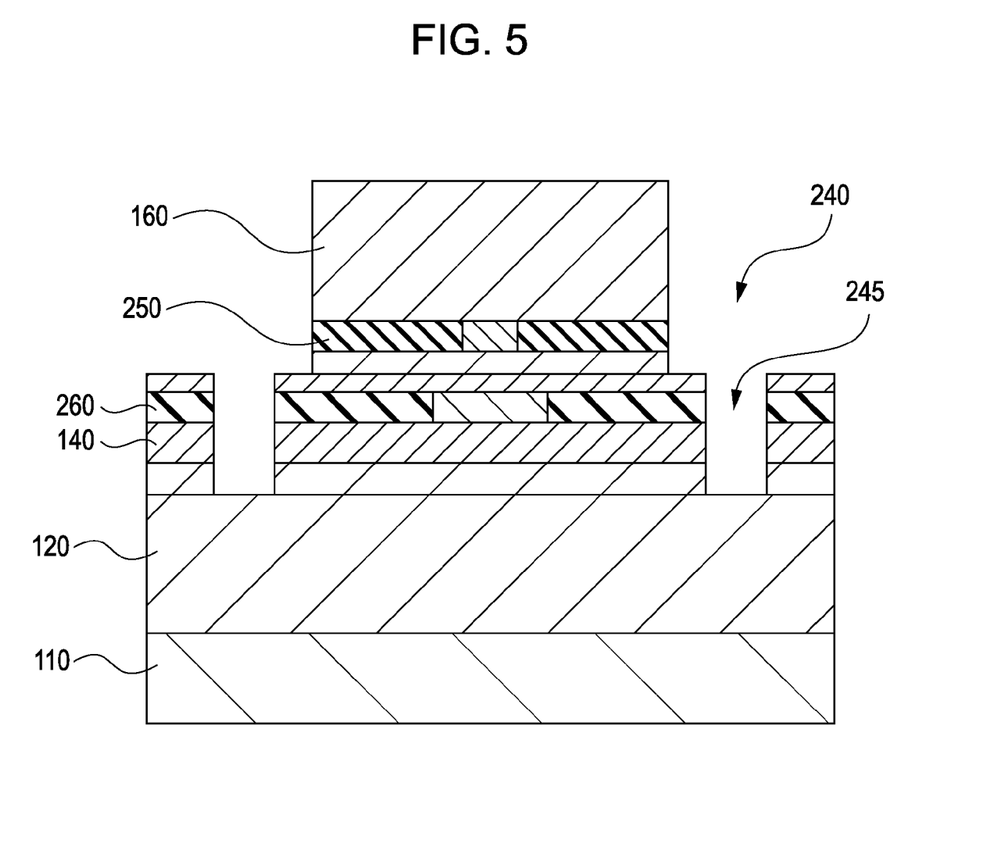
FIG. 5 schematically shows a surface emitting laser according to an embodiment of the present invention.

However, in the second embodiment, as shown in FIG. 5, another trench structure 245 can be newly provided from the bottom of a trench structure 240.

The trench structure 240 first formed is referred to as the "first trench structure" and the trench structure 245 newly formed from the bottom of the trench structure 240 is referred to as the "second trench structure".

In this embodiment, a protective layer can be formed on the sidewall of the exposed first oxidizable layer in the first embodiment. Therefore, the second embodiment has the specific effect of further suppressing oxidation of the first oxidizable layer 250 during oxidation of the second oxidizable layer 260.

FIGS. 6A to 6D show exemplary steps of a manufacturing method of the second embodiment. The manufacturing method of the second embodiment is the same as the manufacturing method described in the first embodiment up to the step shown in FIG. 2E, and thus description up to the step shown in FIG. 2E is omitted.

Figure 6A:
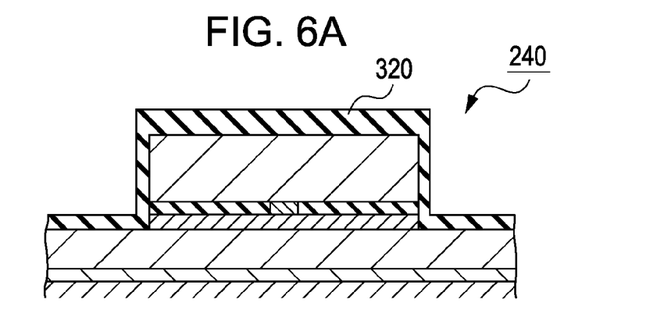
FIGS. 6A to 6D schematically show a progressive flow in a method for manufacturing a surface emitting laser according to an embodiment of the present invention.

As shown in FIG. 6A, a protective layer 320 is deposited on the bottom and side of the first trench structure 240 and on the remaining dielectric layer 300. The protective layer 320 is composed of, for example, silicon oxide and deposited by a plasma CVD method. The protective layer 320 protects the sidewall of the first oxidizable layer when the second oxidizable layer is oxidized.

Figure 6B:
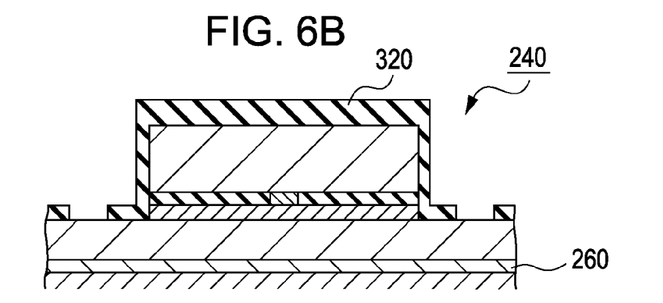

Next, a resist is applied and subjected to patterning for forming the second trench structure 245. Specifically, a pattern having an opening at the bottom of the first trench structure 240 is formed. Then, as shown in FIG. 6B, a portion of the protective layer 320 at the bottom of the first trench structure is removed by etching using the resist pattern as a mask.

Figure 6C:
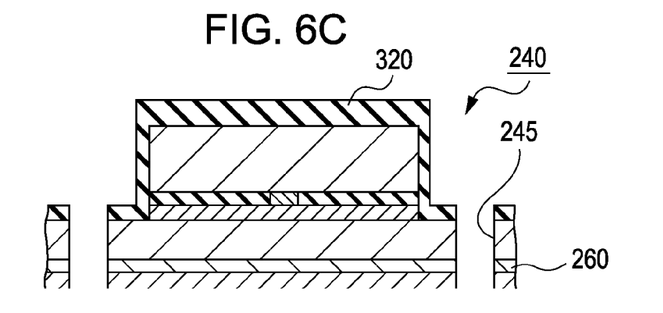

Next, as shown in FIG. 6C, the second trench structure 245 is formed by etching the semiconductor layers using the resist and the protective layer 320 as a mask. The second trench structure 245 is formed by etching up to at least the top of the second oxidizable layer 260. The second trench structure 245 may be stopped at an intermediate position of the second oxidizable layer 260 or may pass through the second oxidizable layer 260.

The etching is, for example, dry etching with $SiCl_4+Ar$ plasma. Wet etching may be performed.

Figure 6D:
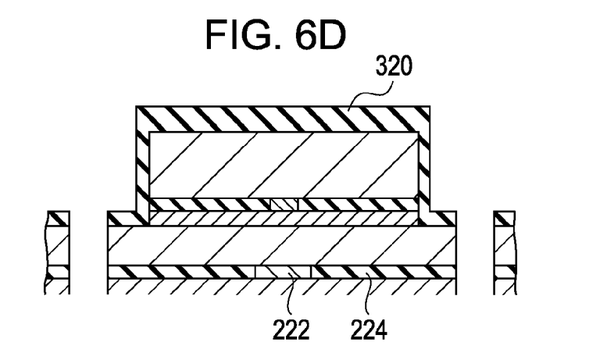

Next, when the resist remains, the resist is removed, and then, as shown in FIG. 6D, the second oxidizable layer 260 is oxidized from the sidewall exposed in the second trench structure 245 to form the second insulating region 224. The oxidation is performed by, for example, heating the substrate to 400° C. and exposing it to stream.

Then, the protective film 320 is removed using, for example, buffered hydrofluoric acid or the like. Subsequent steps are the same as the manufacturing process of the first embodiment, specifically the step shown in FIG. 3I and the subsequent steps, and are thus not described.

Third Embodiment

An image forming apparatus using a surface emitting laser array in which a plurality of surface emitting lasers as described in the first or second embodiment are arranged is described.

Figure 7A:
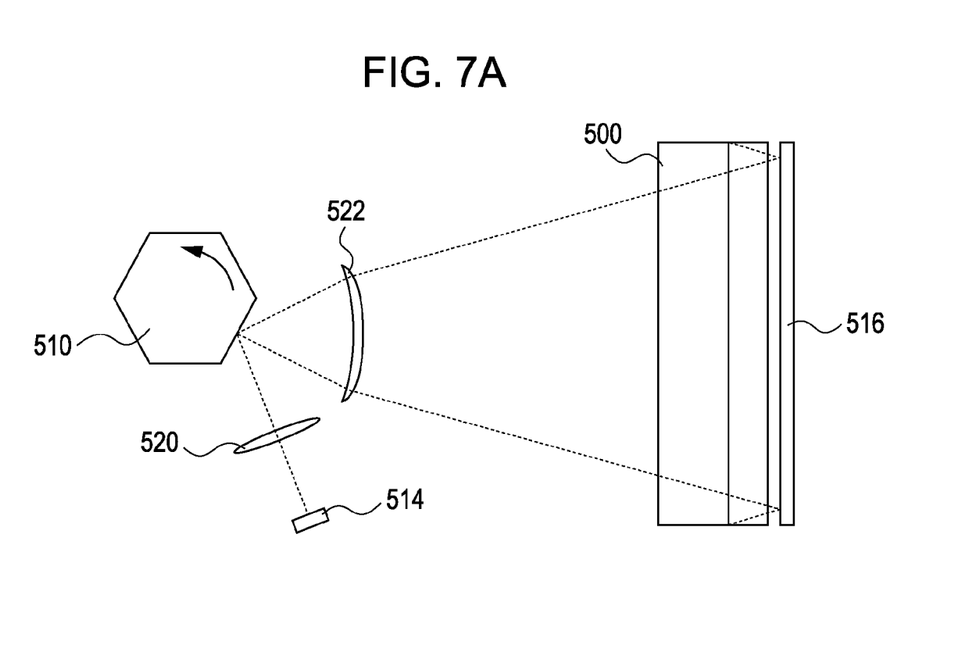
FIGS. 7A and 7B schematically showing an optical device according to an embodiment of the present invention.
Figure 7B:
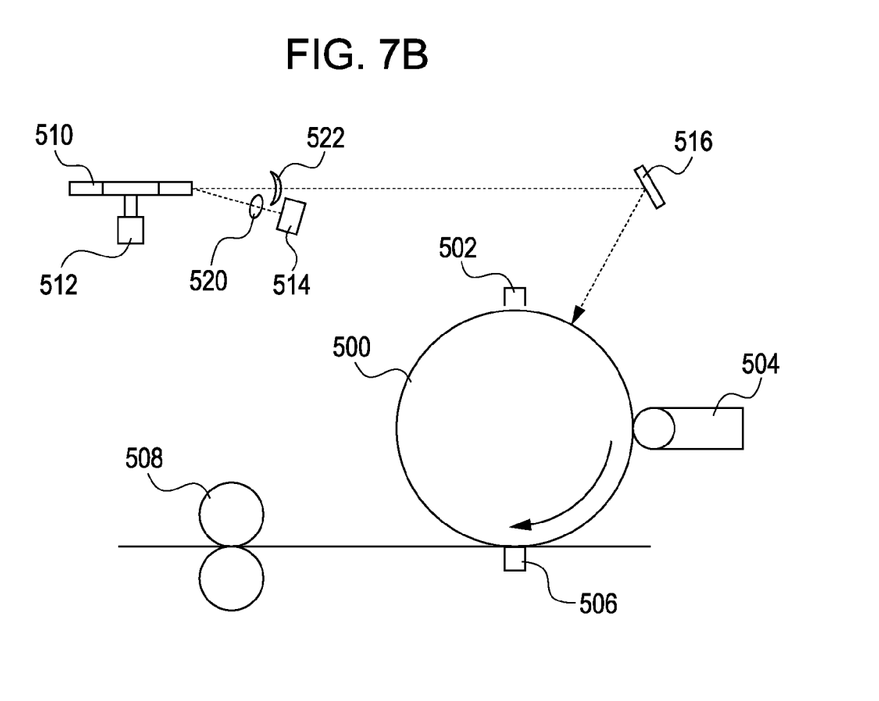

FIGS. 7A and 7B are structural drawings showing an electrophotographic recording-type image forming apparatus provided with a surface emitting laser array according to the present invention. FIG. 7A is a plan view of the image forming apparatus, and FIG. 7B is a side view of the same apparatus. A surface emitting laser array 514 serves as a recording light source and is configured to be turned on or off according to an image signal from a laser driver (not shown).

A modulated laser beam is applied to a polygon mirror 510 from the surface emitting laser array 514 through a collimator lens 520. The polygon mirror 510 is rotated in an arrow direction by a motor 512 so that the laser beam output from the surface emitting laser array 514 is reflected as a deflected beam while the emission angle is continuously changed by the reflection surfaces with rotation of the polygon mirror 510. The reflected light is subjected to correction of distortion and the like with a f-θ lens 522, applied to a photosensitive drum 500 through a reflecting mirror 516, and scan on the photosensitive drum (photosensitive member) 500 in a main scanning direction. At this time, an image corresponding to a plurality lines of the surface emitting laser array 514 is formed in the main scanning direction of the photosensitive drum 500 by reflection of the beam through one surface of the polygon mirror 510. In this embodiment, the surface emitting laser array 514 of 4×8 is used so that an image of 32 lines is formed.

The photosensitive drum 500 is previously electrically charged by a charger 502 and successively exposed to light by scanning laser beams to form an electrostatic latent image.

The photosensitive drum 500 is rotated in an arrow direction (circular arrow in FIG. 7B) so that the formed electrostatic latent image is developed by a development device 504, and the developed visible image is transferred to transfer paper (not shown) by a transfer charger 506.

The transfer paper to which the visible image is transferred is moved to a fixing device 508 and then discharged to the outside of the apparatus after fixing.

Although this embodiment uses the surface emitting laser array of 4×8, the surface emitting laser array is not limited to this, and a surface emitting laser array of m×n (m, n: a natural number (excluding 0)) may be used.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-175391, filed Jul. 28, 2009, which is hereby incorporated by reference herein in its entirety.

What is claimed is:

1. A method for manufacturing a surface emitting laser including a laminate of a lower multilayer minor, an active layer, and an upper multilayer minor which are provided in that order on a substrate, the method comprising:
    a step of forming a second oxidizable layer in the laminate;
    a step of forming a first oxidizable layer above the second oxidizable layer in the laminate;
    a step of partially oxidizing the first oxidizable layer to form a first current confinement layer including a first conductive region and a first insulating region; and
    a step of partially oxidizing the second oxidizable layer to form a second current confinement layer including a second conductive region and a second insulating region after the step of forming the first current confinement layer, a boundary between the first conductive region and the first insulating region being disposed inside the second current confinement layer in an in-plane direction of the substrate,
    wherein the first oxidizable layer and the second oxidizable layer or a layer adjacent to the first oxidizable layer and a layer adjacent to the second oxidizable layer are adjusted so that when both layers are oxidized under the same conditions, the oxidation rate of the first oxidizable layer is lower than that of the second oxidizable layer.

2. The method for manufacturing a surface emitting laser according to claim 1, wherein the first oxidizable layer and the second oxidizable layer contain Al, and the first oxidizable layer has a lower Al composition ratio than that of the second oxidizable layer.

3. The method for manufacturing a surface emitting laser according to claim 1, wherein the first oxidizable layer is thinner than the second oxidizable layer.

4. The method for manufacturing a surface emitting laser according to claim 1, wherein one of the layers adjacent to the first oxidizable layer has a higher Al composition ratio than that of one of the layers adjacent to the second oxidizable layer.

5. The method for manufacturing a surface emitting laser according to claim 1, wherein the temperature of oxidation in the step of forming the first current confinement layer is higher than that in the step of forming the second current confinement layer.

6. The method for manufacturing a surface emitting laser according to claim 1, wherein the oxidizer concentration of an atmosphere in the step of forming the first current confinement layer is higher than that in the step of forming the second current confinement layer.

7. The method for manufacturing a surface emitting laser according to claim 6, wherein the oxidizer is $H_2O$.

8. The method for manufacturing a surface emitting laser according to claim 1, wherein the oxidation inhibitor concentration of an atmosphere in the step of forming the first current confinement layer is higher than that in the step of forming the second current confinement layer.

9. The method for manufacturing a surface emitting laser according to claim 8, wherein the oxidation inhibitor is $O_2$.

10. The method for manufacturing a surface emitting laser according to claim 1, further comprising:
    before the step of forming the first current confinement layer, a step of forming, by etching, a first trench structure extending from the top of the upper multilayer minor to the first oxidizable layer but not reaching the second oxidizable layer; and
    a step of forming, by etching, a second trench structure extending from the bottom of the first trench structure to the second oxidizable layer between the step of forming the first current confinement layer and the step of forming the second current confinement layer.

11. A method for manufacturing a surface emitting laser comprising:
    a step of forming, on a substrate, a laminate including a lower multilayer minor, an active layer, and an upper multilayer mirror, a second oxidizable layer in the laminate, and a first oxidizable layer above the second oxidizable layer in the laminate;
    a step of partially oxidizing the first oxidizable layer to form a first current confinement layer including a first conductive region and a first insulating region; and
    a step of partially oxidizing the second oxidizable layer to form a second current confinement layer including a second conductive region and a second insulating region after the step of forming the first current confinement layer, a boundary between the first conductive region and the first insulating region being disposed inside the second current confinement layer in an in-plane direction of the substrate,
    wherein the first oxidizable layer and the second oxidizable layer or a layer adjacent to the first oxidizable layer and a layer adjacent to the second oxidizable layer are adjusted so that the magnitude of residual stress produced at the boundary between the first conductive region and the first insulating region in the step of forming both regions is smaller than that at the boundary between the second conductive region and the second insulating region in the step of forming both regions.

12. The method for manufacturing a surface emitting laser according to claim 1, wherein the second oxidizable layer is oxidized under conditions where the oxidation rate is lower than the oxidation rate of the first oxidizable layer.

* * * * *